US00RE46922E

(19) United States
(12) Reissued Patent
Jeong et al.

(10) Patent Number: US RE46,922 E
(45) Date of Reissued Patent: Jun. 26, 2018

(54) ORGANIC LIGHT-EMITTING DISPLAY

(71) Applicant: Samsung Display Co., Ltd., Yongin, Gyeonggi-Do (KR)

(72) Inventors: Jong-Han Jeong, Yongin (KR); Steve Y.G. Mo, Yongin (KR); Eun-Hyun Kim, Yongin (KR); Hyun-Sun Park, Yongin (KR)

(73) Assignee: Samsung Display Co., Ltd., Gyeonggi-do (KR)

(21) Appl. No.: 14/819,284

(22) Filed: Aug. 5, 2015

Related U.S. Patent Documents

Reissue of:

(64) Patent No.: 8,502,230
Issued: Aug. 6, 2013
Appl. No.: 13/069,740
Filed: Mar. 23, 2011

(30) Foreign Application Priority Data

Jun. 4, 2010 (KR) ..... 10-2010-0053025

(51) Int. Cl.
*H01L 31/00* (2006.01)
*H01L 27/12* (2006.01)
(Continued)

(52) U.S. Cl.
CPC ..... *H01L 27/1214* (2013.01); *H01L 27/14* (2013.01); *H01L 21/00* (2013.01)

(58) Field of Classification Search
CPC ..... H01L 31/00; H01L 27/3272
(Continued)

(56) References Cited

U.S. PATENT DOCUMENTS 6,855,690 B2 * 2/2005 Benowitz ..... A61K 9/0048 514/20.8
7,335,917 B2 * 2/2008 Koo ..... H01L 21/02422 257/368
(Continued)

FOREIGN PATENT DOCUMENTS

KR 10-1998-0066784 A 10/1998
KR 10-2005-0059017 A 6/2005
(Continued)

OTHER PUBLICATIONS

Korean Office Action dated Dec. 5, 2011 for Korean Patent Application No. KR 10-2010-0053025 which corresponds to captioned U.S. Appl. No. 13/069,740.
(Continued)

*Primary Examiner* — Tuan H Nguyen
(74) *Attorney, Agent, or Firm* — Knobbe Martens Olson & Bear LLP

(57) ABSTRACT

An organic light-emitting display is disclosed. In one embodiment, the display includes i) a substrate, ii) a thin film transistor formed on the substrate, and comprising i) a gate electrode, ii) an active layer electrically insulated from the gate electrode, and iii) source and drain electrodes that are electrically connected to the active layer and iii) a first electrode electrically connected to the thin film transistor. The display further includes an intermediate layer formed on the first electrode and comprising an organic emission layer and a second electrode formed on the intermediate layer, wherein the source electrode or the drain electrode has an
(Continued)

optical blocking portion extending in the direction of substrate thickness.

42 Claims, 2 Drawing Sheets

(51) Int. Cl.
*H01L 27/14* (2006.01)
*H01L 21/00* (2006.01)

(58) Field of Classification Search
USPC ..... 257/60, 43, 59, 72, E51.018
See application file for complete search history.

(56) References Cited

U.S. PATENT DOCUMENTS 7,459,351 B2 * 12/2008 Chen ..... H01L 27/3248 257/59
7,507,998 B2 * 3/2009 Tseng ..... H01L 27/1255 257/300
7,935,579 B2 * 5/2011 Park et al. ..... 438/149
8,237,156 B2 * 8/2012 Kang ..... H01L 27/326 257/40
8,421,084 B2 * 4/2013 Kang ..... H01L 27/12 257/40
8,884,272 B2 * 11/2014 Hama ..... H01L 29/7869 257/40
2007/0170850 A1 * 7/2007 Choi et al. ..... 313/506

FOREIGN PATENT DOCUMENTS

KR 10-2006-0001753 A 1/2006
KR 10-0590249 B1 6/2006
KR 10-2007-0080150 A 8/2007

OTHER PUBLICATIONS

Korean Registration Determination Certificate dated Jan. 29, 2013 for Korean Patent Application No. KR 10-2010-0053025 which corresponds to captioned U.S. Appl. No. 13/069,740.

* cited by examiner

ORGANIC LIGHT-EMITTING DISPLAY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED PATENT APPLICATION

This application *is a broadening reissue of U.S. patent application Ser. No. 13/069,740, filed Mar. 23, 2011, now U.S. Pat. No. 8,502,230, issued Aug. 6, 2013, which* claims the benefit of Korean Patent Application No. 10-2010-0053025, filed on Jun. 4, 2010, in the Korean Intellectual Property Office[,] the [disclosure] *disclosures* of which [is] *are* incorporated herein in [its entirety] *their entireties* by reference.

BACKGROUND

1. Field

The described technology generally relates to an organic light-emitting display.

2. Description of the Related Technology

Today, cathode ray tube (CRT) displays have been largely replaced by flat displays having a thin profile. From among various types of flat display technologies, an organic light-emitting diode (OLED) display is self emissive, and has desirable characteristics such as a large viewing angle, good contrast characteristics, fast response speeds, enhanced brightness and low power consumption. Thus, such a display has drawn widespread attention as the next-generation commercial display.

An organic light-emitting display includes a cathode electrode and an anode electrode with an organic emission layer therebetween. If a voltage is applied to the cathode electrode and the anode electrode, visible light is generated from the organic emission layer.

An active matrix (AM) organic light-emitting display includes driving and switching thin film transistors (TFTs) to provide electrical signals to each OLED. TFTs generally degrade when exposed to light. Generally, the performance of an organic light-emitting display depends on the optical reliability of its TFTs.

The performance of the active semiconductor layer included in the thin film transistor degrades with exposure to visible light generated from the organic emission layer. Accordingly, the electrical characteristics of the thin film transistor are changed, thereby diminishing the image quality of the OLED display.

SUMMARY

One inventive aspect is an organic light-emitting display in which image quality can be easily improved.

Another aspect is an organic light-emitting display including a substrate; a thin film transistor that is disposed on the substrate and includes a gate electrode, an active layer insulated from the gate electrode, and a source electrode and drain electrode that are electrically connected to the active layer; a first electrode that is electrically connected to the thin film transistor; an intermediate layer formed on the first electrode and including an organic emission layer; and a second electrode formed on the intermediate layer, wherein the source electrode or the drain electrode includes an optical blocking unit extending in a thickness direction of the substrate.

The source electrode or the drain electrode may be connected to the first electrode, and the source electrode or drain electrode that is connected to the first electrode may include the optical blocking unit.

The active layer may include an oxide semiconductor material.

The gate electrode may be formed on the substrate, the active layer may be formed over the gate electrode, and the optical blocking unit may include a region that overlaps the gate electrode in a direction perpendicular to the thickness direction of the substrate.

The optical blocking unit may contact the substrate.

The organic light-emitting display may further include a buffer layer between the substrate and the thin film transistor, and the optical blocking unit may contact the buffer layer.

A passivation layer that includes a via-may be hole disposed between the thin film transistor and the first electrode, a via-hole. The source electrode or the drain electrode may be connected to the first electrode via the via-hole. The optical blocking unit may include a region that overlaps the via-hole in the thickness direction of the substrate.

The gate electrode may be formed on the substrate. The active layer may be formed on the gate electrode. The organic light-emitting display may further include a conductive unit formed on the substrate to be disposed apart from the gate electrode. The optical blocking unit and the conductive unit may be connected to each other.

The conductive unit may include the same material as the gate electrode.

The organic light-emitting display may further include a passivation layer disposed between the thin film transistor and the first electrode, the passivation layer including a via-hole. The source electrode or the drain electrode may be connected to the first electrode via the via-hole. The optical blocking unit may include a region that overlaps the via-hole in the thickness direction of the substrate.

The gate electrode and the first electrode may be formed on the substrate to be disposed apart from each other. The active layer may be formed on the gate electrode. The optical blocking unit may include a region that overlaps the gate electrode in a direction perpendicular to the thickness direction of the substrate.

The optical blocking unit may contact a side surface of the first electrode.

The optical blocking unit may contact a side surface of the first electrode facing the gate electrode.

The optical blocking unit may cover a region of a side surface of the first electrode, which contacts the substrate.

The organic light-emitting display may further include a buffer layer disposed between the substrate and the first electrode. The optical blocking unit may cover a region of a side surface of the first electrode that contacts the buffer layer.

Another aspect is an organic light-emitting display comprising: a substrate; a thin film transistor formed on the substrate, and comprising i) a gate electrode, ii) an active layer electrically insulated from the gate electrode, and iii) source and drain electrodes that are electrically connected to the active layer; a first electrode electrically connected to the thin film transistor; an intermediate layer formed on the first electrode and comprising an organic emission layer; and a second electrode formed on the intermediate layer, wherein the source electrode or the drain electrode has an optical blocking portion extending in the direction of substrate thickness.

In the above display, the source electrode or the drain electrode is electrically connected to the first electrode, and wherein the electrode that is connected to the first electrode comprises the optical blocking portion. In the above display, the active layer is formed at least partially of an oxide semiconductor material. In the above display, the gate electrode is formed on the substrate, wherein the active layer is formed over the gate electrode, and wherein the optical blocking portion includes a region that overlaps with at least part of the gate electrode in a direction substantially perpendicular to the substrate thickness.

In the above display, the optical blocking portion contacts the substrate. The above display further comprises a buffer layer formed between the substrate and the thin film transistor, wherein the optical blocking portion contacts the buffer layer. The above display further comprises a passivation layer disposed between the thin film transistor and the first electrode, the passivation layer including a via-hole, wherein the source electrode or the drain electrode is connected to the first electrode by way of the via-hole, and wherein the optical blocking portion includes a region that overlaps with at least part of the via-hole in the thickness direction of the substrate.

In the above display, the gate electrode is formed on the substrate, wherein the active layer is formed on the gate electrode, wherein the organic light-emitting display further comprising a conductive unit formed on the substrate to be disposed apart from the gate electrode, and wherein the optical blocking portion and the conductive unit are connected to each other. In the above display, the conductive unit and the gate electrode are formed of the same material.

The above display further comprises a passivation layer disposed between the thin film transistor and the first electrode, the passivation layer including a via-hole, wherein the source electrode or the drain electrode is electrically connected to the first electrode via the via-hole, and wherein the optical blocking portion includes a region that overlaps with at least part of the via-hole in the thickness direction of the substrate.

In the above display, the gate electrode and the first electrode are formed on the substrate to be disposed apart from each other, wherein the active layer is formed on the gate electrode, and wherein the optical blocking portion includes a region that overlaps with at least part of the gate electrode in a direction substantially perpendicular to the thickness direction of the substrate. In the above display, the optical blocking portion contacts a side surface of the first electrode. In the above display, the optical blocking portion contacts a side surface of the first electrode facing the gate electrode.

In the above display, the optical blocking portion at least partially covers a side surface of the first electrode, which contacts the substrate. The above display further comprises a buffer layer disposed between the substrate and the first electrode, wherein the optical blocking portion at least partially covers a side surface of the first electrode that contacts the buffer layer.

Another aspect is an organic light-emitting display comprising: a thin film transistor (TFT) formed on a substrate, wherein the TFT comprises i) a gate electrode, ii) an active layer electrically insulated from the gate electrode, and iii) source and drain electrodes electrically connected to the active layer; a first electrode electrically connected to the TFT; an organic light emission layer formed on the first electrode and configured to emit light; and a second electrode formed on the organic light emission layer, wherein a portion of at least one of the source electrode and the drain electrode extends in the direction of substrate thickness and is configured to substantially block the emitted light from entering the active layer of the TFT.

In the above display, only one of the source and drain electrodes includes the portion, and wherein the electrode having the portion is formed to be closer to the organic light emitting layer than the other electrode. The above display further comprises a gate insulating layer formed between the gate electrode and active layer, wherein the portion at least partially penetrates the gate insulating layer. In the above display, the portion substantially completely penetrates the gate insulating layer. In the above display, the portion contacts the substrate or a conductive unit formed between the portion and substrate.

DETAILED DESCRIPTION

Hereinafter, certain embodiments will be described in detail with reference to the accompanying drawings.

Figure 1:
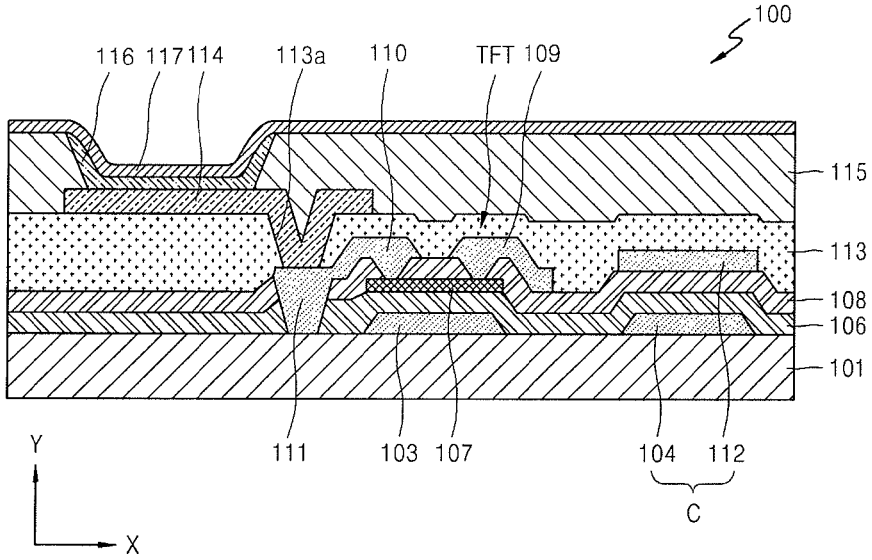
FIG. 1 is a schematic cross-sectional view of an organic light-emitting display according to an embodiment.

FIG. 1 is a schematic cross-sectional view of an organic light-emitting display 100 according to an embodiment. Referring to FIG. 1, the display 100 includes a substrate 101, a thin film transistor (TFT), a first electrode 114, an intermediate layer 116, a second electrode 117, and an optical blocking unit (or optical blocking portion) 111. The TFT includes a gate electrode 103, an active layer 107, a source electrode 109, and a drain electrode 110. The source electrode 109 or the drain electrode 110 includes the optical blocking unit 111.

The substrate 101 may be formed of a glass material, the main ingredient of which is $SiO_2$ but is not limited thereto and may be formed of any transparent plastic material. The transparent plastic material may be an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

Although not shown, a buffer layer may be formed on the substrate 101 to provide a planar surface on the substrate 101 and to prevent moisture or foreign substances from permeating into the substrate 101. This applies to the embodiments of FIGS. 1 and 2.

The gate electrode 103 is formed on the substrate 101. The gate electrode 103 may be formed of at least one material selected from the group consisting of Au, Ag, Cu, Ni, Pt, Pd, Al, Mo, an Al:Nd alloy, and a Mo:W alloy but is not limited thereto and may include various conductive materials.

A first capacitor electrode 104 is formed on the substrate 101. The first capacitor electrode 104 may be formed of the same material as the gate electrode 103. In one embodiment, the first capacitor electrode 104 is simultaneously formed with the gate electrode 103 by performing a patterning process only once.

A gate insulating layer 106 is formed on the gate electrode 103 and the first capacitor electrode 104. The gate insulating layer 106 insulates the gate electrode 103 and the active layer 107 from each other.

The active layer 107 is formed on the gate insulating layer 106. The active layer 107 may include various materials. The active layer 107 may include an oxide semiconductor material but is not limited thereto and may include crystalline silicon or amorphous silicon.

An etch stopper 108 is formed on the active layer 107. The source electrode 109 and the drain electrode 110 are formed on the etch stopper 108. The source electrode 109 and the drain electrode 110 contact an exposed region of the active layer 107, which is not covered by the etch stopper 108.

That is, a region that acts as a channel of surfaces of the active layer 107 is protected by the etch stopper 108. The etch stopper 108 prevents an upper surface of the active layer 107 from being damaged during an etch process for patterning the source electrode 109 and the drain electrode 110. The etch stopper 108 may be formed of various insulating materials.

Each of the source electrode 109 and the drain electrode 110 may be formed, but is not limited to, of at least one material selected from the group consisting of Au, Pd, Pt, Ni, Rh, Ru, Ir, Os, Al, Mo, an Al:Nd alloy, and a MoW alloy.

In one embodiment, the source electrode 109 or the drain electrode 110 includes the optical blocking unit 111. In another embodiment, each of the source electrode 109 and the drain electrode 110 includes the optical blocking unit 111. If only one of the electrodes 109 and 110 includes the optical unit 111, the electrode having the optical unit 111 may be formed to be closer to the light emitting region than the other electrode to efficiently block light from entering the TFT or at least the active layer 107. This applies to the embodiments of FIGS. 2 and 3. In the current embodiment, the drain electrode 110 includes the optical blocking unit 111. The optical blocking unit 111 extends from a region of the drain electrode 110. In one embodiment, the unit 111 extends in a thickness direction of the substrate 101, i.e., a Y-axis direction in FIG. 1.

In one embodiment, the optical blocking unit 111 is formed of the same material as the drain electrode 110 and thus prevents light from penetrating into the active layer 107. In particular, the optical blocking unit 111 prevents light generated from the intermediate layer 116 from being incident on a side or bottom surface of the active layer 107. In one embodiment, the optical blocking unit 111 is formed to partially overlap the gate electrode 103 in a direction substantially perpendicular to the thickness direction of the substrate 101, i.e., an X-axis direction in FIG. 1. For example, the optical blocking unit 111 may be formed on the same layer on which the gate electrode 103 is formed. That is, the optical blocking unit 111 is formed to contact the substrate 101. If the buffer layer is formed, the optical blocking unit 111 is formed to contact the buffer layer.

A second capacitor electrode 112 is formed on the etch stopper 108 to overlap the first capacitor electrode 104. The first capacitor electrode 104 and the second capacitor electrode 112 together form one capacitor C. The second capacitor electrode 112 may be formed of the same material as the source electrode 109 and the drain electrode 110. In one embodiment, the second capacitor electrode 112 is substantially simultaneously formed with the source electrode 109 and the drain electrode 110 by performing a patterning process only once.

A passivation layer 113 is formed on the source electrode 109, the drain electrode 110, and the second capacitor electrode 112. The passivation layer 113 may be formed of various insulating materials including organic or inorganic materials. Also, the passivation layer 113 may have a stacked structure of organic and inorganic materials. The passivation layer 113 includes a via-hole 113a for exposing a region of the drain electrode 110.

The first electrode 114 is formed on the passivation layer 113. The first electrode 114 is electrically connected to the drain electrode 110 via the via-hole 113a. The first electrode 114 may be a transmissive electrode or a reflective electrode.

If the first electrode 114 is a transmissive electrode, then the first electrode 114 may include ITO, IZO, ZnO, or $In_2O_3$. Otherwise, if the first electrode 114 is a reflective electrode, then the first electrode 114 may be fabricated by forming a reflective layer by using at least one material selected from the group consisting of Ag, Mg, Al, Pt, Pd, Au, Ni, Nd, Ir, and Cr and forming an ITO, IZO, ZnO, or $In_2O_3$ layer on the resultant structure.

In the current embodiment, the drain electrode 110 is electrically connected to the first electrode 114 but this arrangement is not considered limiting and the source electrode 109 may be connected to the first electrode 114. If the source electrode 109 is electrically connected to the first electrode 114, the source electrode 109 includes the optical blocking unit 111.

A pixel defining layer 115 is formed on the first electrode 114. The pixel defining layer 115 may include various insulating materials and may be formed to expose a predetermined region of the first electrode 114. The intermediate layer 116 is formed on the exposed region of the first electrode 114. The second electrode 117 is formed on the intermediate layer 116.

The intermediate layer 116 includes an organic emission layer (not shown). When a voltage is applied to the first electrode 114 and the second electrode 117, visible light is emitted from the organic emission layer of the intermediate layer 116.

If the organic emission layer of the intermediate layer 116 is a low-molecular weight organic layer, then a hole transport layer (HTL) and a hole injection layer (HIL) may be included between the organic emission layer and the first electrode 114 and an electron transport layer (ETL) and an electron injection layer (EIL) may be included between the organic emission layer and the second electrode 117.

If the organic emission layer of the intermediate layer 116 is a high molecular weight organic layer, then the HTL may be included between the organic emission layer and the first electrode 114.

The second electrode 117 is formed to substantially cover all pixels. The second electrode 117 may be a transmissive or reflective electrode.

If the second electrode 117 is a transmissive electrode, then the second electrode 117 may be fabricated by stacking a layer formed of at least one selected from the group consisting of Li, Ca, LiF/Ca, LiF/Al, Al, Ag, and Mg, and a transmissive conductive layer, such as ITO, IZO, ZnO, or In2O3. Alternatively, if the second electrode 117 is a reflective electrode, then the second electrode 117 is formed of at least one material selected from the group consisting of Li, Ca, LiF/Ca, LiF/Al, Al, Ag, and Mg.

In the current embodiment, the first electrode 114 and the second electrode 117 are an anode electrode and a cathode electrode, respectively. In another embodiment, the first electrode 114 and the second electrode 117 may be a cathode electrode and an anode electrode, respectively. Also, the above-described materials of the first electrode 114 and the second electrode 117 are just examples and various materials may be used to form them.

A sealing unit (not shown) may be formed on the second electrode 117. In one embodiment, the sealing unit is formed of a transparent material to protect the intermediate layer 116 and the other layers from external moisture or oxygen. The sealing unit may include glass, plastic, or a plurality of stacked layers including organic and inorganic materials.

In the organic light-emitting display 100, the drain electrode 110 includes the optical blocking unit 111. The optical blocking unit 111 extends in the thickness direction of the substrate 101 and thus prevents light from being incident on a side surface of the active layer 107.

The characteristics of the active layer 107 are likely to be changed by light, thereby degrading the optical reliability of the TFT. In particular, when the active layer 107 includes an oxide semiconductor material, the active layer 107 is very sensitive to light.

However, in the current embodiment, the active layer 107 is prevented from being exposed to light so that the characteristics of the active layer 107 may not change, thereby preventing the optical reliability of the TFT from degrading. In particular, light generated from the intermediate layer 116 is prevented from being incident on the side surface of the active layer 107, thereby protecting the active layer 107 from light.

The image quality of the organic light-emitting display 100 is generally influenced by the characteristics of the TFT. In the current embodiment, the active layer 107 included in the TFT is prevented from degrading due to light, and thus, the optical reliability of the TFT is enhanced and the image quality of the organic light-emitting display 100 is improved accordingly.

In one embodiment, the optical blocking unit 111 is formed to reach the same layer on which the gate electrode 103 is formed. That is, the optical blocking unit 111 is formed to contact the substrate 101, thereby maximizing the blocking of light incident on the active layer 107.

Also, the optical blocking unit 111 partially overlaps the via-hole 113a so that the thickness of a region of the drain electrode 110 that contacts the first electrode 114 may be increased, thus reducing contact resistance in an interface region between the first electrode 114 and the drain electrode 110. Furthermore, light incident from the intermediate layer 116 onto the active layer 107 may be blocked effectively.

Figure 2:
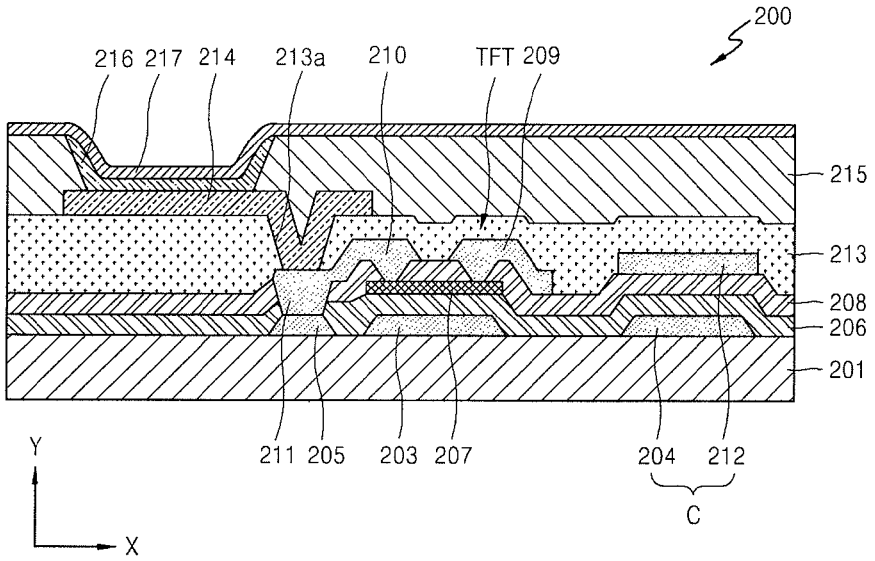
FIG. 2 is a schematic cross-sectional view of an organic light-emitting display according to another embodiment.

FIG. 2 is a schematic cross-sectional view of an organic light-emitting display 200 according to another embodiment. For convenience of explanation, the organic light-emitting display 200 will now be described focusing on the differences with respect to the FIG. 1 embodiment.

Referring to FIG. 2, the organic light-emitting display 200 includes a substrate 201, a TFT, a first electrode 214, an intermediate layer 216, a second electrode 217, a conductive unit 205, and an optical blocking unit 211. The TFT includes a gate electrode 203, an active layer 207, a source electrode 209, and a drain electrode 210. The source electrode 209 or the drain electrode 210 includes the optical blocking unit 211. The gate electrode 203 is formed on the substrate 201. A first capacitor electrode 204 is formed on the substrate 201. The first capacitor electrode 204 may be formed of the same material as the gate electrode 203.

The conductive unit 205 is also formed on the substrate 201 to be disposed apart from the gate electrode 203. The conductive unit 205 is formed of the same material as the gate electrode 203. The gate electrode 203 and the conductive unit 205 may be formed substantially simultaneously by performing a patterning process once.

A gate insulating layer 206 is formed on the gate electrode 203, the first capacitor electrode 204, and the conductive unit 205. The active layer 207 is formed on the gate insulating layer 206. An etch stopper 208 is formed on the active layer 207, and the source electrode 209 and the drain electrode 210 are formed on the etch stopper 208. The source electrode 209 and the drain electrode 210 contact an exposed region of the active layer 207, which is not covered by the etch stopper 208.

The source electrode 209 or the drain electrode 210 includes the optical blocking unit 211. In the current embodiment, the drain electrode 210 includes the optical blocking unit 211. The optical blocking unit 211 extends from a region of the drain electrode 210, and more particularly, extends in a thickness direction of the substrate 201, i.e., a Y-axis direction in FIG. 2. The optical blocking unit 211 is connected to the conductive unit 205.

In one embodiment, the optical blocking unit 211 is formed of the same material as the drain electrode 210 and blocks light from being incident on the active layer 207. The optical blocking unit 211 is formed to be connected to the conductive unit 205, on the same layer on which the gate electrode 203 is formed, and thus, the optical blocking unit 211 and the conductive unit 205 effectively prevent light from being incident on a side or bottom surface of the active layer 207.

A second capacitor electrode 212 is formed on the etch stopper 208 to overlap the first capacitor electrode 204. The first capacitor electrode 204 and the second capacitor electrode 212 together form one capacitor C.

A passivation layer 213 is formed on the source electrode 209, the drain electrode 210, and the second capacitor electrode 212. The passivation layer 213 includes a via-hole 213a to expose a region of the drain electrode 210.

The first electrode 214 is formed on the passivation layer 213. The first electrode 214 is electrically connected to the drain electrode 210 via the via-hole 213a. In the current embodiment, the drain electrode 210 is electrically connected to the first electrode 214. However, the source electrode 209 may be connected to the first electrode 214. When the source electrode 209 is connected to the first electrode 214, the source electrode 209 includes the optical blocking unit 211.

A pixel defining layer 215 is formed on the first electrode 214. The pixel defining layer 215 may include various insulating materials and exposes a predetermined region of the first electrode 214. The intermediate layer 216 is formed on the exposed region of the first electrode 214. The second electrode 217 is formed on the intermediate layer 216.

A sealing unit (not shown) may be formed on the second electrode 217. The sealing unit protects the intermediate layer 216 and the other layers from external moisture or oxygen. T he sealing unit may include glass, plastic, or a plurality of stacked layers including organic and inorganic materials.

In the organic light-emitting display 200, the drain electrode 210 includes the optical blocking unit 211. The optical blocking unit 211 extends in the thickness direction of the substrate 201, and is also connected to the conductive unit 205. Thus, it is possible to prevent the properties of the active layer 207 from degrading due to light by blocking light from being incident on a side or bottom surface of the active layer 207, thereby improving the image quality of the organic light-emitting display 200.

For example, the optical blocking unit 211 does not need to extend to the substrate 201 owing to the conductive unit 205, thereby simplifying a process of forming the optical blocking unit 211.

Also, the optical blocking unit 211 partially overlaps the via-hole 213a, and thus, the thickness of the drain electrode 210 that contacts the first electrode 214 is increased, thus reducing contact resistance in an interface region between the first electrode 214 and the drain electrode 210. Furthermore, it is possible to effectively block light from being incident from the intermediate layer 216 onto the active layer 207.

Figure 3:
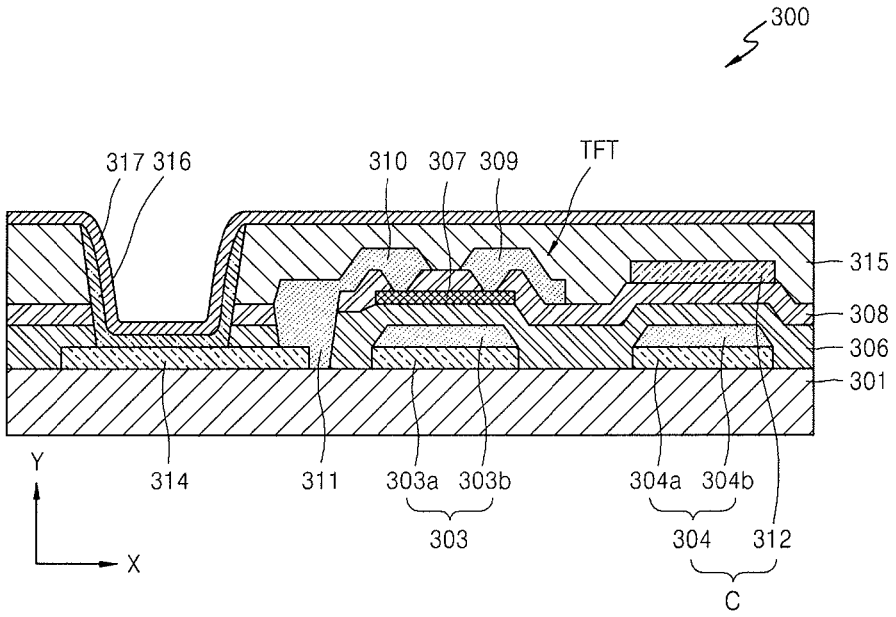
FIG. 3 is a schematic cross-sectional view of an organic light-emitting display according to another embodiment.

FIG. 3 is a schematic cross-sectional view of an organic light-emitting display 300 according to another embodiment. For convenience of explanation, the organic light-emitting display 300 will now be described focusing on the differences with respect tot the embodiments shown in FIGS. 1 and 2.

Referring to FIG. 3, the organic light-emitting display 300 includes a substrate 301, a TFT, a first electrode 314, an intermediate layer 316, a second electrode 317, and an optical blocking unit 311. The TFT includes a gate electrode 303, an active layer 307, a source electrode 309, and a drain electrode 310. The source electrode 309 or the drain electrode 310 includes the optical blocking unit 311.

Specifically, the gate electrode 303, a first capacitor electrode 304, and the first electrode 314 are formed on the substrate 301. The gate electrode 303 includes a first conductive layer 303a and a second conductive layer 303b. Each of the first conductive layer 303a and the second conductive layer 303b may be formed of various materials. For example, the first conductive layer 303a may be formed of a transmissive conductive material, such as ITO, IZO, or $In_2O_3$, and the second conductive layer 303b may be formed of at least one material selected from the group consisting of Mo, W, Al, Cu, and Ag.

The first capacitor electrode 304 includes a first layer 304a and a second layer 304b. The first capacitor electrode 304 may be formed of the same material as the gate electrode 303. That is, the first layer 304a may be formed of the same material as the first conductive layer 303a and the second layer 304b may be formed of the same material as the second conductive layer 303b.

The first electrode 314 is formed on the substrate 301 to be disposed apart from the gate electrode 303 and may be formed of the same material as the first conductive layer 303a of the gate electrode 303.

The gate electrode 303, the first capacitor electrode 304, and the first electrode 314 may be patterned substantially simultaneously. In this regard, photolithography may be performed using a half-tone mask.

A gate insulating layer 306 is formed on the gate electrode 303, the first capacitor electrode 304, and the first electrode 314. The active layer 307 is formed on the gate insulating layer 306. An etch stopper 308 is formed on the active layer 307, and the source electrode 309 and the drain electrode 310 are formed on the etch stopper 308. The source electrode 309 and the drain electrode 310 contact exposed regions of the active layer 307 that are not covered by the etch stopper 308, respectively.

The drain electrode 310 is electrically connected to the first electrode 314. The gate insulating layer 306 and the etch stopper 308 are etched from the first electrode 314 so as to expose a region of the first electrode 314, and the drain electrode 310 is connected to the exposed region of the first electrode 314.

The source electrode 309 or the drain electrode 310 includes the optical blocking unit 311. In the current embodiment, the drain electrode 310 includes the optical blocking unit 311. The optical blocking unit 311 extends from a region of the drain electrode 310, and more particularly, extend in a thickness direction of the substrate 301, i.e., a Y-axis direction in FIG. 3.

Also, the optical blocking unit 311 partially overlaps the gate electrode 303 in a direction substantially perpendicular to the thickness direction of the substrate 301, i.e., an X-axis direction. For example, the optical blocking unit 311 contacts a side surface of the first electrode 314. The optical blocking unit 311 may contact a side surface of the first electrode 314 facing the gate electrode 303. Also, the optical blocking unit 311 is formed to cover an interface region between a side surface of the first electrode 314 and the substrate 301.

Although not shown, if the buffer layer is formed between the substrate 301 and the first electrode 314, the optical blocking unit 311 is formed to cover an interface region between a side surface of the first electrode 314 and the buffer layer.

In one embodiment, the optical blocking unit 311 is formed of the same material as the drain electrode 310 and blocks light from being incident on the active layer 307. According to one embodiment, since the optical blocking unit 311 contacts the side surface of the first electrode 314, light generated from the intermediate layer 316 may be effectively prevented from being incident on a side or bottom surface of the active layer 307 via the side surface of the first electrode 314.

A second capacitor electrode 312 is formed on the etch stopper 308 to overlap the first capacitor electrode 304. The first capacitor electrode 304 and the second capacitor electrode 312 together form one capacitor C.

A pixel defining layer 315 is formed on the source electrode 309, the drain electrode 310, and the second capacitor electrode 312. Predetermined regions of the pixel defining layer 315, the gate insulating layer 306, and the etch stopper 308 are etched to expose a region of the first electrode 314. The intermediate layer 316 is formed on the exposed region of the first electrode 314. The second electrode 317 is formed on the intermediate layer 316.

In the current embodiment, since the pixel defining layer 315 also acts as a passivation layer, the thickness of the organic light-emitting display 300 decreases and the efficiency of a process of fabricating the display 300 increases.

A sealing unit (not shown) may be formed on the second electrode 317. The sealing unit protects the intermediate layer 316 and the other layers from external moisture or oxygen. The sealing unit may be formed of a transparent material. The sealing unit may include glass, plastic, or a plurality of stacked layers including organic and inorganic materials.

In the organic light-emitting display 300, the drain electrode 310 includes the optical blocking unit 311. The optical blocking unit 311 extends in the thickness direction of the substrate 301. Also, the optical blocking unit 311 contacts the side surface of the first electrode 314 facing the gate electrode 303, thereby blocking light from being incident on a side or bottom surface of the active layer 307. Also, light passing through a side surface of the first electrode 314 is prevented from being incident on the active layer 307. Accordingly, the performance of the active layer 307 is not degraded by light, and thus, the image quality of the display 300 is enhanced.

Thus, it is possible to improve image quality.

While certain embodiments have been particularly shown and described, it will be understood by those of ordinary skill in the art that various changes in form and details may be made therein without departing from the spirit and scope of the following claims.

What is claimed is:

1. An organic light-emitting display comprising:

a substrate;

a thin film transistor formed on the substrate, and comprising i) a gate electrode, ii) an active layer electrically insulated from the gate electrode, wherein the active layer has top and bottom surfaces opposing each other and a side surface interposed between the top and bottom surfaces and iii) source and drain electrodes that are electrically connected to the top surface of the active layer;

a first electrode electrically connected to the thin film transistor;

an intermediate layer formed on the first electrode and comprising an organic emission layer; and a second electrode formed on the intermediate layer, wherein the source electrode or the drain electrode [has] *includes i) a body portion and ii)* an optical blocking portion *integrally formed with the body portion and directly* extending *from the body portion* in the direction of substrate thickness, [and] wherein the optical blocking portion is closer to the substrate than the bottom surface of the active layer*, wherein the active layer is closer to the substrate than the intermediate layer, wherein the active layer includes a connect region directly connected to the source and drain electrodes, wherein the optical blocking portion is closer to the substrate than the connect region, wherein the optical blocking portion or the body portion contacts the first electrode, wherein the optical blocking portion is disposed in a hole of at least an insulating layer, and wherein the optical blocking portion fully fills the hole of the insulating layer*.

2. The organic light-emitting display of claim 1, wherein the source electrode or the drain electrode is electrically connected to the first electrode, and wherein the source or drain electrode that is connected to the first electrode comprises the optical blocking portion.

3. The organic light-emitting display of claim 1, wherein the active layer is formed at least partially of an oxide semiconductor material.

4. The organic light-emitting display of claim 1, wherein the gate electrode is formed on the substrate, wherein the active layer is formed over the gate electrode, and wherein the optical blocking portion includes a region that overlaps with at least part of the gate electrode in a direction substantially perpendicular to the substrate thickness.

5. The organic light-emitting display of claim 4, wherein the optical blocking portion contacts the substrate.

6. The organic light-emitting display of claim 4, further comprising a buffer layer formed between the substrate and the thin film transistor, wherein the optical blocking portion contacts the buffer layer.

7. The organic light-emitting display of claim 4, further comprising a passivation layer disposed between the thin film transistor and the first electrode, the passivation layer including a via-hole, wherein the source electrode or the drain electrode is connected to the first electrode by way of the via-hole, and wherein the optical blocking portion includes a region that overlaps with at least part of the via-hole in the thickness direction of the substrate.

8. The organic light-emitting display of claim 1, wherein the gate electrode is formed on the substrate, *and* wherein the active layer is formed on the gate electrode[, wherein the organic light-emitting display further comprising a conductive unit formed on the substrate to be disposed apart from the gate electrode, and wherein the optical blocking portion and the conductive unit are connected to each other].

9. The organic light-emitting display of claim 8, wherein the conductive unit and the gate electrode are formed of the same material.

10. The organic light-emitting display of claim 8, further comprising a passivation layer disposed between the thin film transistor and the first electrode, the passivation layer including a via-hole, wherein the source electrode or the drain electrode is electrically connected to the first electrode via the via-hole, and wherein the optical blocking portion includes a region that overlaps with at least part of the via-hole in the thickness direction of the substrate.

11. The organic light-emitting display of claim 1, wherein the gate electrode and the first electrode are formed on the substrate to be disposed apart from each other, wherein the active layer is formed on the gate electrode, and wherein the optical blocking portion includes a region that overlaps with at least part of the gate electrode in a direction substantially perpendicular to the thickness direction of the substrate.

12. [The] *An* organic light-emitting display [of claim 11], comprising:*

*a substrate;*

*a thin film transistor formed on the substrate, and comprising i) a gate electrode, ii) an active layer electrically insulated from the gate electrode, wherein the active layer has top and bottom surfaces opposing each other and a side surface interposed between the top and bottom surfaces and iii) source and drain electrodes that are electrically connected to the top surface of the active layer;*

*a first electrode electrically connected to the thin film transistor;*

*an intermediate layer formed on the first electrode and comprising an organic emission layer; and*

*a second electrode formed on the intermediate layer,*

*wherein the source electrode or the drain electrode includes i) a body portion and ii) an optical blocking portion integrally formed with the body portion and directly extending from the body portion in the direction of substrate thickness, and wherein the optical blocking portion is closer to the substrate than the bottom surface of the active layer,*

*wherein the gate electrode and the first electrode are formed on the substrate to be disposed apart from each other,*

*wherein the active layer is formed on the gate electrode,*

*wherein the optical blocking portion includes a region that overlaps with at least part of the gate electrode in a direction substantially perpendicular to the thickness direction of the substrate, and* wherein the optical blocking portion contacts a side surface of the first electrode.

13. [The] *An* organic light-emitting display [of claim 11], *comprising:*

*a substrate;*

*a thin film transistor formed on the substrate, and comprising i) a gate electrode, ii) an active layer electrically insulated from the gate electrode, wherein the active layer has top and bottom surfaces opposing each other and a side surface interposed between the top and bottom surfaces and iii) source and drain electrodes that are electrically connected to the top surface of the active layer;*

*a first electrode electrically connected to the thin film transistor;*

*an intermediate layer formed on the first electrode and comprising an organic emission layer; and*

*a second electrode formed on the intermediate layer,*

*wherein the source electrode or the drain electrode includes i) a body portion and ii) an optical blocking portion integrally formed with the body portion and directly extending from the body portion in the direction of substrate thickness, and wherein the optical blocking portion is closer to the substrate than the bottom surface of the active layer,*

*wherein the gate electrode and the first electrode are formed on the substrate to be disposed apart from each other,*

*wherein the active layer is formed on the gate electrode,*

*wherein the optical blocking portion includes a region that overlaps with at least part of the gate electrode in a direction substantially perpendicular to the thickness direction of the substrate, and* wherein the optical blocking portion contacts a side surface of the first electrode facing the gate electrode.

14. [The] *An* organic light-emitting display [of claim 11], *comprising:*

*a substrate;*

*a thin film transistor formed on the substrate, and comprising i) a gate electrode, ii) an active layer electrically insulated from the gate electrode, wherein the active layer has top and bottom surfaces opposing each other and a side surface interposed between the top and bottom surfaces and iii) source and drain electrodes that are electrically connected to the top surface of the active layer;*

*a first electrode electrically connected to the thin film transistor;*

*an intermediate layer formed on the first electrode and comprising an organic emission layer; and*

*a second electrode formed on the intermediate layer,*

*wherein the source electrode or the drain electrode includes i) a body portion and ii) an optical blocking portion integrally formed with the body portion and directly extending from the body portion in the direction of substrate thickness, and wherein the optical blocking portion is closer to the substrate than the bottom surface of the active layer,*

*wherein the gate electrode and the first electrode are formed on the substrate to be disposed apart from each other,*

*wherein the active layer is formed on the gate electrode,*

*wherein the optical blocking portion includes a region that overlaps with at least part of the gate electrode in a direction substantially perpendicular to the thickness direction of the substrate, and* wherein the optical blocking portion at least partially covers a side surface of the first electrode, which contacts the substrate.

15. [The] *An* organic light-emitting display [of claim 11, further] comprising*:*

*a substrate;*

*a thin film transistor formed on the substrate, and comprising i) a gate electrode, ii) an active layer electrically insulated from the gate electrode, wherein the active layer has top and bottom surfaces opposing each other and a side surface interposed between the top and bottom surfaces and iii) source and drain electrodes that are electrically connected to the top surface of the active layer;*

*a first electrode electrically connected to the thin film transistor;*

*an intermediate layer formed on the first electrode and comprising an organic emission layer; and*

*a second electrode formed on the intermediate layer,* a buffer layer disposed between the substrate and the first electrode,

*wherein the source electrode or the drain electrode includes i) a body portion and ii) an optical blocking portion integrally formed with the body portion and directly extending from the body portion in the direction of substrate thickness, wherein the optical blocking portion is closer to the substrate than the bottom surface of the active layer,*

*wherein the gate electrode and the first electrode are formed on the substrate to be disposed apart from each other,*

*wherein the active layer is formed on the gate electrode,*

*wherein the optical blocking portion includes a region that overlaps with at least part of the gate electrode in a direction substantially perpendicular to the thickness direction of the substrate, and* wherein the optical blocking portion at least partially covers a side surface of the first electrode that contacts the buffer layer.

16. An organic light-emitting display comprising:

a thin film transistor (TFT) formed on a substrate, wherein the TFT comprises i) a gate electrode, ii) an active layer electrically insulated from the gate electrode wherein the active layer has top and bottom surfaces opposing each other and a side surface interposed between the top and bottom surfaces, and iii) source and drain electrodes electrically connected to the top surface of the active layer;

a first electrode electrically connected to the TFT;

an organic light emission layer formed on the first electrode and configured to emit light; and a second electrode formed on the organic light emission layer, wherein [a portion of] at least one of the source electrode and the drain electrode *includes i) a body portion and ii) a portion integrally formed with the body portion, wherein the portion directly* extends *from the body portion* in the direction of substrate thickness and is configured to substantially block the emitted light from entering the active layer of the TFT, [and] wherein the portion is closer to the substrate than the bottom surface of the active layer, *wherein the active layer is closer to the substrate than the organic light emission layer, wherein the active layer includes a connect region directly connected to the source and drain electrodes, wherein the portion is closer to the substrate than the connect region, wherein the portion or the body portion*

*contacts the first electrode, wherein the portion is disposed in a hole of at least an insulating layer, and wherein the portion fully fills the hole of the insulating layer.*

17. The organic light-emitting display of claim 16, wherein only one of the source and drain electrodes includes the portion, and wherein the electrode having the portion is formed to be closer to the organic light emitting layer than the other electrode.

18. The organic light-emitting display of claim 16, further comprising a gate insulating layer formed between the gate electrode and active layer, wherein the portion at least partially penetrates the gate insulating layer.

19. The organic light-emitting display of claim 18, wherein the portion substantially completely penetrates the gate insulating layer.

20. The organic light-emitting display of claim 19, wherein the portion contacts the substrate or a conductive unit formed between the portion and substrate.

*21. The organic light-emitting display of claim 1, wherein the optical blocking portion directly contacts the first electrode.*

*22. An organic light-emitting display comprising:*

*a substrate;*

*a conductive unit formed on the substrate;*

*a thin film transistor comprising a gate electrode, an active layer including an oxide semiconductor material, a first insulating layer between the gate electrode and active layer, a source electrode and a drain electrode;*

*an anode electrode connected to the drain electrode;*

*an intermediate layer formed on the anode electrode and comprising an organic emission layer; and*

*a cathode electrode formed on the intermediate layer, wherein the drain electrode includes a body portion and an extending portion integrally formed with the body portion, wherein the extending portion is connected to the conductive unit, wherein the first insulating layer is formed on the conductive unit, wherein the extending portion is disposed in a contact hole of at least the first insulating layer, and wherein the extending portion fully fills the hole of the first insulating layer.*

*23. The organic light-emitting display of claim 22, wherein the extending portion is connected to the conductive unit through the contact hole.*

*24. The organic light-emitting display of claim 23, wherein the conductive unit includes at least one material selected from the group consisting of Au, Ag, Cu, Ni, Pt, Pd, Al, and Mo.*

*25. The organic light-emitting display of claim 24, wherein the conductive unit contacts the substrate.*

*26. The organic light-emitting display of claim 25, wherein the extending portion includes a region extending in a direction substantially perpendicular to the substrate.*

*27. The organic light-emitting display of claim 26, further comprising a buffer layer formed between the substrate and the thin film transistor, wherein the extending portion contacts the buffer layer.*

*28. The organic light-emitting display of claim 24, wherein the extending portion includes a region extending in a direction substantially perpendicular to the substrate.*

*29. The organic light-emitting display of claim 24, further comprising a buffer layer formed between the substrate and the thin film transistor, wherein the extending portion contacts the buffer layer.*

*30. The organic light-emitting display of claim 23, wherein the conductive unit contacts the substrate.*

*31. The organic light-emitting display of claim 23, wherein the extending portion includes a region extending in a direction substantially perpendicular to the substrate.*

*32. The organic light-emitting display of claim 23, further comprising a buffer layer formed between the substrate and the thin film transistor, wherein the extending portion contacts the buffer layer.*

*33. The organic light-emitting display of claim 22, wherein the conductive unit includes at least one material selected from the group consisting of Au, Ag, Cu, Ni, Pt, Pd, Al, and Mo.*

*34. The organic light-emitting display of claim 33, wherein the conductive unit contacts the substrate.*

*35. The organic light-emitting display of claim 33, wherein the extending portion includes a region extending in a direction substantially perpendicular to the substrate.*

*36. The organic light-emitting display of claim 33, further comprising a buffer layer formed between the substrate and the thin film transistor, wherein the extending portion contacts the buffer layer.*

*37. The organic light-emitting display of claim 22, wherein the conductive unit contacts the substrate.*

*38. The organic light-emitting display of claim 37, wherein the extending portion includes a region extending in a direction substantially perpendicular to the substrate.*

*39. The organic light-emitting display of claim 37, further comprising a buffer layer formed between the substrate and the thin film transistor, wherein the extending portion contacts the buffer layer.*

*40. The organic light-emitting display of claim 22, wherein the extending portion includes a region extending in a direction substantially perpendicular to the substrate.*

*41. The organic light-emitting display of claim 40, further comprising a buffer layer formed between the substrate and the thin film transistor, wherein the extending portion contacts the buffer layer.*

*42. The organic light-emitting display of claim 22, further comprising a buffer layer formed between the substrate and the thin film transistor, wherein the extending portion contacts the buffer layer.*

* * * * *